United States Patent
Augustyniak et al.

(10) Patent No.: US 10,081,869 B2
(45) Date of Patent: Sep. 25, 2018

(54) DEFECT CONTROL IN RF PLASMA SUBSTRATE PROCESSING SYSTEMS USING DC BIAS VOLTAGE DURING MOVEMENT OF SUBSTRATES

(71) Applicant: Lam Research Corporation, Fremont, CA (US)

(72) Inventors: Edward Augustyniak, Tualatin, OR (US); Christopher James Ramsayer, Tualatin, OR (US); Akhil N. Singhal, Beaverton, OR (US); Kareem Boumatar, Vancouver, WA (US)

(73) Assignee: Lam Research Corporation, Fremont, CA (US)

( * ) Notice: Subject to any disclaimer, the term of this patent is extended or adjusted under 35 U.S.C. 154(b) by 932 days.

(21) Appl. No.: 14/300,854

(22) Filed: Jun. 10, 2014

(65) Prior Publication Data
US 2015/0357161 A1 Dec. 10, 2015

(51) Int. Cl.
*C23C 16/505* (2006.01)
*C23C 16/458* (2006.01)
*H01J 37/32* (2006.01)
*C23C 16/44* (2006.01)

(52) U.S. Cl.
CPC ........ *C23C 16/458* (2013.01); *C23C 16/4401* (2013.01); *H01J 37/32091* (2013.01); *H01J 37/32146* (2013.01); *H01J 37/32706* (2013.01); *H01J 37/32752* (2013.01)

(58) Field of Classification Search
None
See application file for complete search history.

(56) References Cited

U.S. PATENT DOCUMENTS

| | | |
|---|---|---|
| 4,795,880 A | 1/1989 | Hayes et al. |
| 5,017,404 A | 5/1991 | Paquet et al. |
| 5,102,496 A | 4/1992 | Savas |
| 5,242,561 A | 9/1993 | Sato |
| 5,294,320 A | 3/1994 | Somekh et al. |
| 5,321,634 A | 6/1994 | Obata et al. |
| 5,401,356 A | 3/1995 | Enami et al. |
| 5,449,432 A | 9/1995 | Hanawa |
| 5,478,429 A | 12/1995 | Komino et al. |

(Continued)

FOREIGN PATENT DOCUMENTS

| | | |
|---|---|---|
| CN | 1957437 | 5/2007 |
| EP | 0697467 A1 | 2/1996 |

(Continued)

*Primary Examiner* — Aiden Lee

(57) ABSTRACT

A substrate processing system includes a processing chamber and an upper electrode arranged in the processing chamber. A pedestal is configured to support a substrate during processing and includes a lower electrode. An RF generating system is configured to generate RF plasma between the upper electrode and the lower electrode by supplying an RF voltage. A bias generating circuit is configured to selectively supply a DC bias voltage to one of the upper electrode and the lower electrode. A start of the DC bias voltage is initiated one of a first predetermined period before the RF plasma is extinguished and a second predetermined period after the RF plasma is extinguished. A substrate movement system is configured to move the substrate relative to the pedestal while the DC bias voltage is generated.

20 Claims, 9 Drawing Sheets

(56) References Cited

U.S. PATENT DOCUMENTS

| | | | |
|---|---|---|---|
| 5,573,597 A * | 11/1996 | Lantsman | H01J 37/32431 118/723 E |
| 5,625,170 A | 4/1997 | Poris | |
| 5,672,242 A | 9/1997 | Jen | |
| 5,676,759 A | 10/1997 | Ye et al. | |
| 5,779,807 A | 7/1998 | Dornfest et al. | |
| 5,788,871 A | 8/1998 | Huh | |
| 5,788,877 A | 8/1998 | Shiflett | |
| 5,854,138 A | 12/1998 | Roth et al. | |
| 5,902,494 A | 5/1999 | Gupta et al. | |
| 5,919,531 A | 7/1999 | Arkles et al. | |
| 5,924,058 A | 7/1999 | Waldhauer et al. | |
| 6,089,181 A | 7/2000 | Suemasa et al. | |
| 6,139,923 A | 10/2000 | Gupta | |
| 6,184,489 B1 | 2/2001 | Ito et al. | |
| 6,194,234 B1 | 2/2001 | Huang et al. | |
| 6,214,160 B1 | 4/2001 | Dornfest et al. | |
| 6,237,527 B1 | 5/2001 | Kellerman et al. | |
| 6,245,189 B1 | 6/2001 | Rigali et al. | |
| 6,256,825 B1 | 7/2001 | Hwang | |
| 6,286,685 B1 | 9/2001 | Kononchuk et al. | |
| 6,290,821 B1 | 9/2001 | McLeod | |
| 6,352,049 B1 | 3/2002 | Yin et al. | |
| 6,365,009 B1 | 4/2002 | Ishibashi | |
| 6,375,860 B1 | 4/2002 | Ohkawa et al. | |
| 6,423,176 B1 | 7/2002 | Ito et al. | |
| 6,428,673 B1 | 8/2002 | Ritzdorf et al. | |
| 6,517,912 B1 | 2/2003 | Morfill et al. | |
| 6,616,987 B1 | 9/2003 | Morfill et al. | |
| 6,642,531 B1 | 11/2003 | Powers | |
| 6,708,559 B2 | 3/2004 | Chen et al. | |
| 6,709,522 B1 | 3/2004 | Condrashoff et al. | |
| 6,749,717 B1 | 6/2004 | Sandhu et al. | |
| 6,777,880 B2 | 8/2004 | Morfill et al. | |
| 6,790,376 B1 | 9/2004 | Markle et al. | |
| 6,793,832 B1 | 9/2004 | Saito et al. | |
| 6,808,592 B1 | 10/2004 | Rigali et al. | |
| 6,841,033 B2 | 1/2005 | Condrashoff et al. | |
| 6,843,858 B2 | 1/2005 | Rossman | |
| 6,893,532 B1 | 5/2005 | Sato et al. | |
| 6,902,620 B1 * | 6/2005 | Omstead | C23C 16/45551 117/102 |
| 6,902,647 B2 | 6/2005 | Hasper | |
| 6,922,603 B1 | 7/2005 | Bailey, III | |
| 6,972,071 B1 | 12/2005 | Tyler | |
| 7,020,577 B2 | 3/2006 | Wilby | |
| 7,045,465 B2 | 5/2006 | Ito et al. | |
| 7,052,622 B2 | 5/2006 | Chinn et al. | |
| 7,102,763 B2 | 9/2006 | Ritzdorf et al. | |
| 7,152,461 B2 | 12/2006 | Temmler et al. | |
| 7,161,689 B2 | 1/2007 | Ritzdorf et al. | |
| 7,201,823 B2 | 4/2007 | Rigali et al. | |
| 7,335,601 B2 | 2/2008 | Han et al. | |
| 7,340,372 B2 | 3/2008 | Wilby | |
| 7,528,386 B2 | 5/2009 | Ruzic et al. | |
| 7,651,586 B2 | 1/2010 | Moriya et al. | |
| 7,659,212 B2 | 2/2010 | Tsuchiya et al. | |
| 7,728,252 B2 | 6/2010 | Morikawa et al. | |
| 7,799,138 B2 | 9/2010 | Fontejon, Jr. et al. | |
| 7,892,863 B2 | 2/2011 | Wilby et al. | |
| 7,967,913 B2 | 6/2011 | Hua et al. | |
| 8,052,798 B2 | 11/2011 | Moriya et al. | |
| 8,192,806 B1 | 6/2012 | Varadarajan et al. | |
| 8,200,353 B2 | 6/2012 | Wilby et al. | |
| 8,200,447 B2 | 6/2012 | Wilby et al. | |
| 8,202,394 B2 | 6/2012 | Moriya et al. | |
| 8,282,983 B1 | 10/2012 | Kapoor et al. | |
| 8,357,548 B2 | 1/2013 | Wilby | |
| 8,364,302 B2 | 1/2013 | Kiermasz | |
| 8,367,302 B2 | 2/2013 | Kim et al. | |
| 8,501,500 B2 | 8/2013 | Yang et al. | |
| 8,591,659 B1 | 11/2013 | Fang et al. | |
| 8,603,293 B2 | 12/2013 | Koshiishi et al. | |
| 8,608,422 B2 | 12/2013 | Moriya et al. | |
| 9,478,408 B2 | 10/2016 | Kang et al. | |
| 2001/0025606 A1 | 10/2001 | Ichijo | |
| 2005/0133059 A1 | 6/2005 | Chen et al. | |
| 2006/0060303 A1 | 3/2006 | Fink et al. | |
| 2006/0066247 A1 * | 3/2006 | Koshiishi | H01J 37/32018 315/111.21 |
| 2006/0191479 A1 | 8/2006 | Mizukami et al. | |
| 2008/0053817 A1 * | 3/2008 | Koshimizu | H01J 37/32027 204/164 |
| 2008/0142481 A1 | 6/2008 | White et al. | |
| 2008/0302652 A1 | 12/2008 | Entley et al. | |
| 2010/0055904 A1 * | 3/2010 | Chen | C23C 16/0281 438/680 |
| 2010/0206098 A1 | 8/2010 | Wilby | |
| 2011/0011534 A1 | 1/2011 | Dhindsa | |
| 2011/0015773 A1 | 1/2011 | Wilby | |
| 2011/0160889 A1 | 6/2011 | Kuboi et al. | |
| 2011/0162674 A1 | 7/2011 | Tang et al. | |
| 2011/0272097 A1 | 11/2011 | Koshiishi et al. | |
| 2012/0107586 A1 | 5/2012 | Yu et al. | |
| 2012/0158169 A1 | 6/2012 | Finn et al. | |
| 2013/0118816 A1 | 5/2013 | Wilby | |
| 2013/0149800 A1 | 6/2013 | Kiermasz | |
| 2014/0124138 A1 | 5/2014 | Gosselin | |
| 2015/0354059 A1 | 12/2015 | Kang et al. | |
| 2015/0354061 A1 | 12/2015 | Dhas et al. | |
| 2017/0011893 A1 | 1/2017 | Kang et al. | |

FOREIGN PATENT DOCUMENTS

| | | |
|---|---|---|
| TW | 287293 B | 10/1996 |
| WO | WO2004/095502 | 11/2004 |
| WO | WO2005/119731 | 12/2005 |

* cited by examiner

DEFECT CONTROL IN RF PLASMA SUBSTRATE PROCESSING SYSTEMS USING DC BIAS VOLTAGE DURING MOVEMENT OF SUBSTRATES

FIELD

The present disclosure relates to substrate processing systems, and more particularly to defect control in substrate processing systems using RF plasma.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal. For example in chemical vapor deposition (CVD) or atomic layer deposition (ALD) processes, a gas mixture including one or more precursors may be introduced into the processing chamber to deposit a film on the substrate or to etch the substrate.

In some substrate processing systems, radio frequency (RF) plasma may be used to activate chemical reactions. Some chemical reactions that happen in the gas phase lead to nucleation, clustering, and/or agglomeration of particles in a reactive volume of the RF plasma. The particles remain suspended in the RF plasma while the RF plasma is on. The particles do not fall onto the substrate due to a balance of forces acting upon the particles. For example, electrostatic repulsion suspends the particles in the RF plasma at a plasma boundary or plasma sheath.

After the RF excitation is turned off, the particles may fall onto the substrate. Therefore, most substrate processing systems evacuate the processing chamber by pumping residual gases for a predetermined period. During the predetermined period, the particles settle down in the processing chamber or are evacuated by the pump.

SUMMARY

A substrate processing system includes a processing chamber and an upper electrode arranged in the processing chamber. A pedestal is arranged in the processing chamber. The pedestal is configured to support a substrate during processing. The pedestal includes a lower electrode. An RF generating system is configured to generate RF plasma in the processing chamber between the upper electrode and the lower electrode by supplying an RF voltage to one of the upper electrode and the lower electrode. A bias generating circuit is configured to selectively supply a DC bias voltage to one of the upper electrode and the lower electrode. A start of the DC bias voltage is initiated one of a first predetermined period before the RF plasma is extinguished and a second predetermined period after the RF plasma is extinguished. A substrate movement system is configured to move the substrate relative to the pedestal while the DC bias voltage is generated.

In other features, the bias generating circuit includes a DC voltage supply. A synchronization circuit is in communication with the DC voltage supply and is configured to generate the DC bias voltage.

In other features, the bias generating circuit further includes a low pass filter configured to filter an output of the synchronization circuit and having an output in communication with one of the upper electrode and the lower electrode. The substrate movement system includes a robot configured to move the substrate relative to the pedestal.

A substrate processing tool includes N reactors each including a plurality of the substrate processing systems, where N is an integer greater than zero. The substrate movement system includes an indexing mechanism configured to index substrates between the plurality of the substrate processing systems of at least one of the N reactors while the DC bias voltage is generated.

In other features, the DC bias voltage and the RF voltage are both connected to one of the upper electrode and the lower electrode. The bias generating circuit generates the DC bias voltage before the RF plasma is extinguished and ends the DC bias voltage before a subsequent RF plasma is struck. The bias generating circuit generates the DC bias voltage after the RF plasma is extinguished and ends the DC bias voltage before a subsequent RF plasma is struck. The bias generating circuit generates the DC bias voltage continuously except during a period when the RF plasma is struck.

In other features, the RF generating system includes an RF generator to generate the RF voltages and a matching and distribution network in communication with the RF generator and the one of the upper electrode and the lower electrode.

A substrate processing system includes a processing chamber and an upper electrode arranged in the processing chamber. A pedestal is arranged in the processing chamber and is configured to support a substrate. The pedestal includes a lower electrode. An RF generating system is configured to generate RF plasma in the processing chamber between the upper electrode and the lower electrode by supplying an RF voltage to the upper electrode. A bias generating circuit is configured to selectively start supplying a DC bias voltage to the upper electrode one of a first predetermined period before an end of the RF voltage and a second predetermined period after the RF voltage.

In other features, the bias generating circuit includes a DC voltage supply. A synchronization circuit is in communication with the DC voltage supply and is configured to generate the DC bias voltage. The bias generating circuit further includes a low pass filter configured to filter an output of the synchronization circuit and having an output in communication with the upper electrode.

In other features, a substrate movement system is configured to move the substrate relative to the pedestal while the DC bias voltage is generated. A robot is configured to move the substrate relative to the pedestal. The robot moves the substrate while the DC bias voltage is generated.

A substrate processing tool includes N reactors each including a plurality of the substrate processing systems, where N is an integer greater than zero. An indexing mechanism is configured to index substrates between the plurality of the substrate processing systems of at least one of the N reactors while the DC bias voltage is generated.

In other features, the bias generating circuit generates the DC bias voltage before the RF plasma is extinguished and ends the DC bias voltage after the RF plasma is extinguished. The bias generating circuit generates the DC bias voltage after the RF plasma is extinguished and ends the DC bias voltage before a subsequent RF plasma is struck. The bias generating circuit generates the DC bias voltage continuously except when the RF plasma is struck.

In other features, the RF generating system includes an RF generator to generate the RF voltages and a matching and distribution network in communication with the RF generator and the upper electrode.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An RF plasma substrate processing system according to the present disclosure applies a DC bias voltage to one of an upper electrode or a lower electrode in correlation with timing of the RF plasma. In some examples, the DC bias voltage is applied before the RF plasma is extinguished and is maintained until after the RF plasma is extinguished. In some examples, the DC bias voltage is applied after the RF plasma is extinguished. The DC bias voltage alters trajectories of the charged particles during evacuation of the processing chamber and reduces defect counts on substrates caused by the particles suspended in the RF plasma during extinction. While the DC bias voltage is applied to the upper electrode or the lower electrode, the substrate may be moved or indexed as required by the processing system.

Figure 1A:
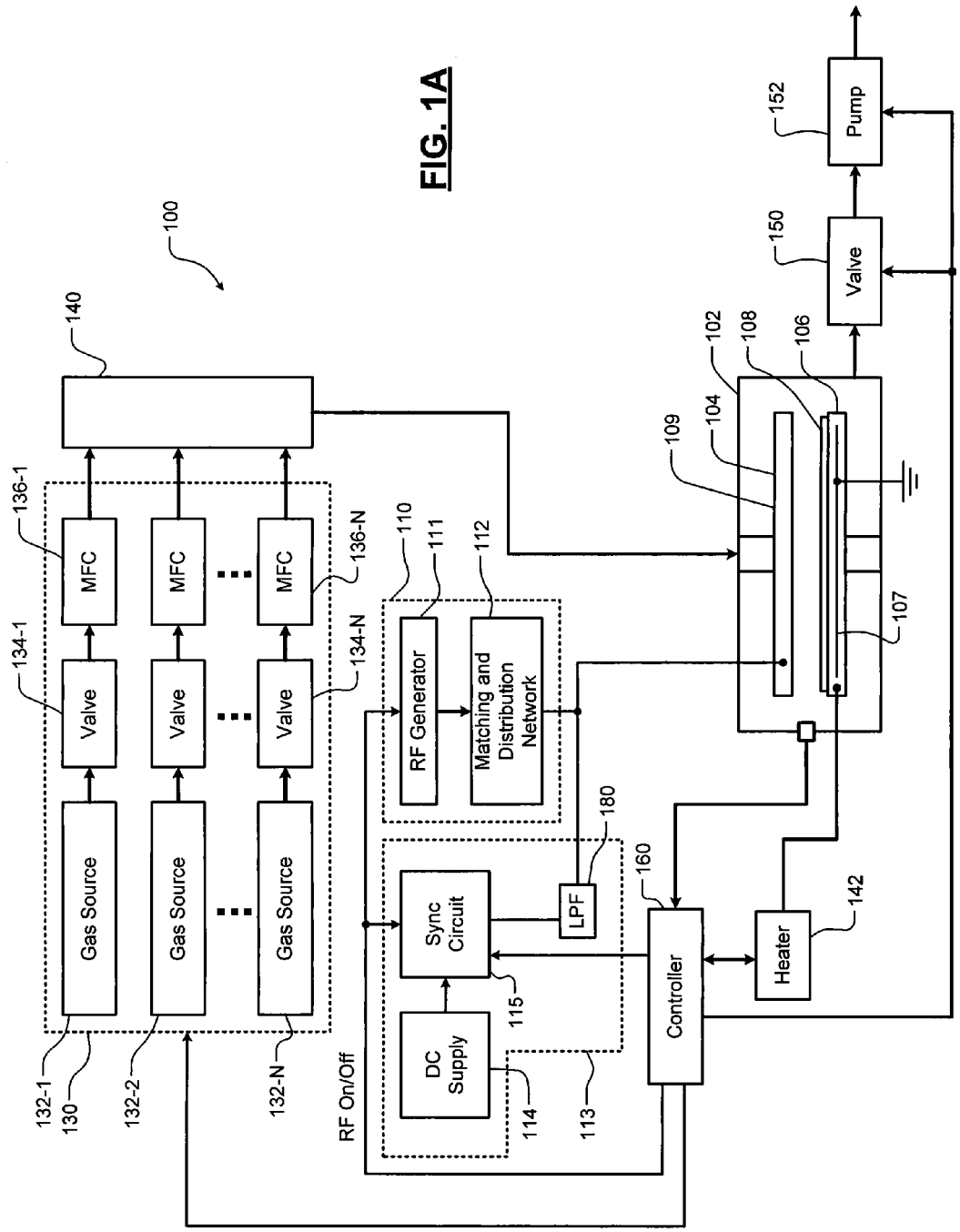
FIG. 1A is a functional block diagram of an example of a substrate processing system according to the present disclosure.

Referring now to FIG. 1A, an example of a substrate processing system 100 for performing deposition or etching using RF plasma is shown. The substrate processing system 100 includes a processing chamber 102 that encloses other components of the substrate processing system 100 and contains the RF plasma. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a showerhead 109 that introduces and distributes process gases. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode and the lower electrode. The other one of the upper electrode and the lower electrode may be DC grounded, AC grounded or floating. For example only, the RF generating system 110 may include an RF voltage generator 111 that generates the RF voltage that is fed by a matching and distribution network 112 to the upper electrode 104 or the lower electrode 107.

As will be described further below, a bias generating circuit 113 generates a DC bias voltage in response to on/off timing of the RF voltage and other timing parameters described below. In some examples, the bias generating circuit 113 may further include a DC voltage supply 114 that provides a DC voltage signal. The bias generating circuit 113 may further include a synchronization circuit 115 that switches on/off the DC voltage signal in response to the RF on/off signal. The synchronization circuit 115 determines the timing of the DC bias voltage based on the timing of the RF on/off signal. In some examples, the synchronization circuit 115 applies a delay to transitions of the RF on/off signal to determine a starting point of the DC bias voltage. Duration of the DC bias voltage may be set as well. In some examples, the DC bias voltage is applied to the electrode that receives the RF voltage to generate the RF plasma.

An example of a gas delivery system 130 is shown in FIG. 1A. A gas delivery system 130 includes one or more gas sources 132-1, 132-2, ..., and 132-N (collectively gas sources 132), where N is an integer greater than zero. The gas sources supply one or more precursors and mixtures thereof. Vaporized precursor may also be used. The gas sources 132 are connected by valves 134-1, 134-2, ..., and 134-N (collectively valves 134) and mass flow controllers 136-1, 136-2, ..., and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102.

A controller 160 may be used to control components of the substrate processing system 100. The controller 160 sends the RF plasma on/off signals to the RF generating system 110 and the synchronization circuit 115. The controller 160 may also set timing parameters for the DC bias voltage such as time on and delay relative to a start or end of the RF plasma on/off signals.

For example only, the DC bias voltage may be a DC voltage having a magnitude of 100 to 600 volts and a positive or negative polarity. The DC bias voltage establishes an electrostatic field that alters trajectories of the charged particles suspended in the plasma when the RF plasma is turned off. The particles are still charged from immersion in the RF plasma after the RF plasma is turned off. At the same time, the processing chamber may be evacuated. The DC bias affected trajectories of the charged particles may bypass the substrate on their way to pumping ports and effectively protect the substrate from contamination.

Figure 1B:
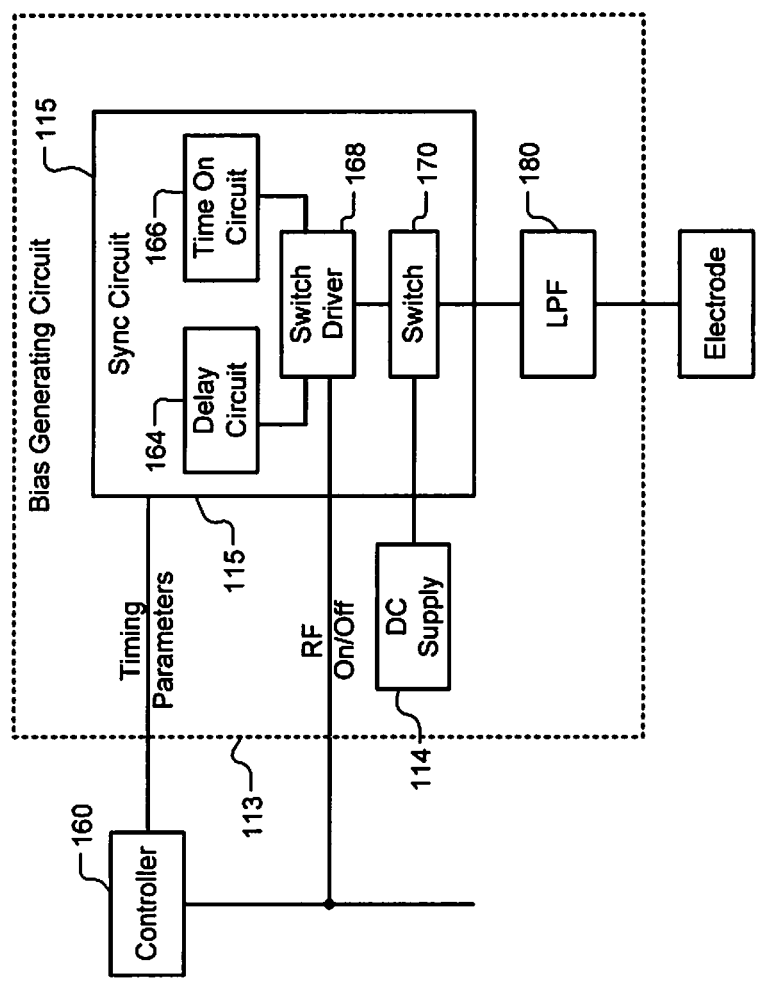
FIG. 1B is a functional block diagram of an example of a DC bias generating system according to the present disclosure.

Referring now to FIG. 1B, an example of the bias generating circuit 113 is shown. The bias generating circuit 113 includes a delay circuit 164 to store one or more delay times based on transitions of the RF plasma on/off signals. The bias generating circuit 113 includes a time on circuit 166 to store one or more durations of one or more DC bias voltages. Outputs of the delay circuit 164, the time on circuit 166 and the RF on/off signals are input to a switch driver 168, which generates switch drive signals to turn a switch 170 on and off as needed to provide the DC bias voltage. In some examples, an output of the synchronization circuit 115 is isolated from the RF voltage by an optional low pass filter (LPF) 180.

For example only, the switch driver 168 includes a trigger circuit that is enabled by a transition to RF on or RF off. Once triggered, the switch driver 168 waits a delay period that is set by the delay circuit 164. After the delay period, the switch driver 168 turns on the DC bias voltage by closing the switch 170 for a time on period that is set by the time on circuit 166. After the time on period, the switch driver 168 opens the switch 170 to turn off the DC bias voltage. As can be appreciated, the DC bias voltage can be triggered in any other suitable manner.

Figure 2:
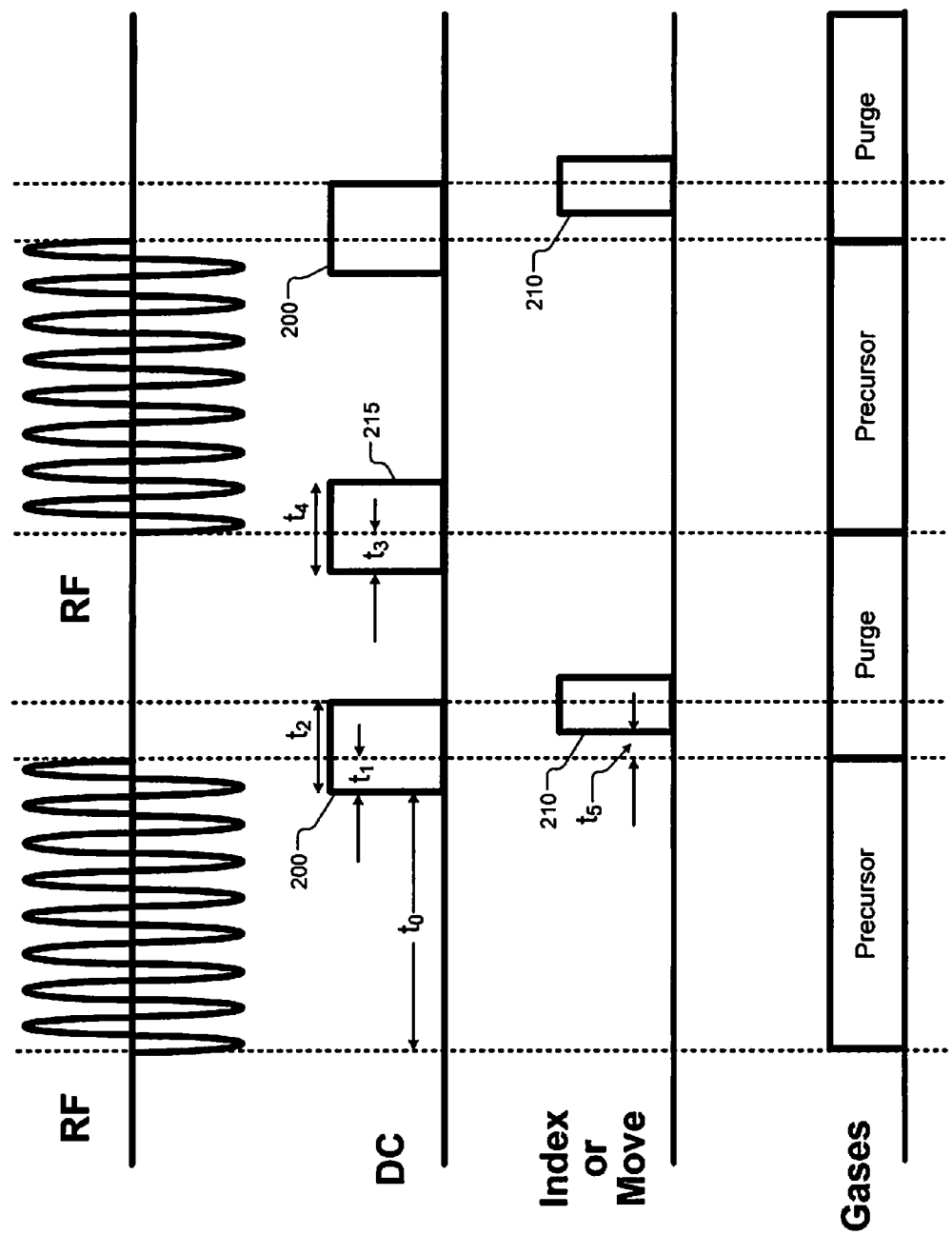
FIGS. 2 and 3 are timing diagrams illustrating examples of timing of a DC bias voltage relative to RF plasma signals, substrate indexing or movement signals and gas supply signals.
Figure 3:
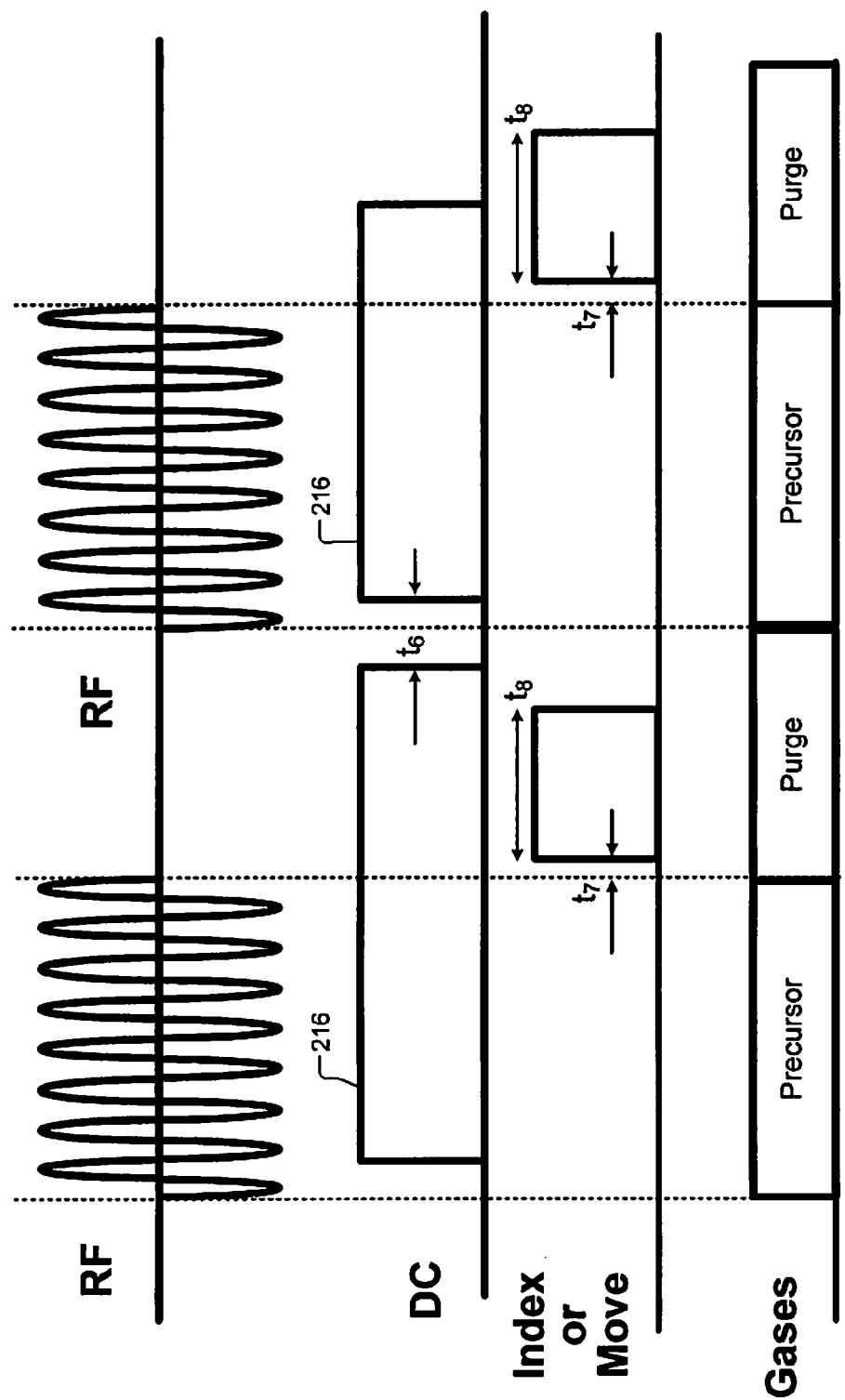

Referring now to FIGS. 2-3, examples of timing of various DC bias voltages are shown. In FIG. 2, an example of timing of the DC bias voltage is shown relative to the RF plasma signal, substrate index or movement signals, and gas supply signals. Typically, one or more gas or vapor precursors will be supplied while the RF plasma is on. Purge gases such as inert gases may be supplied when the RF plasma is off.

In some examples, a DC bias voltage 200 is initiated before the RF plasma signal is terminated and continues until after the RF plasma signal is terminated. The timing of the DC bias voltage 200 may be based on a delay $t_0$ from a start of the RF voltage. The timing of the DC bias voltage 200 overlaps the RF voltage by a period $t_1$, has a duration $t_2$ and continues after the RF voltage ends for a period $(t_2-t_1)$.

In some examples, the DC bias voltage is supplied while the substrate is being indexed or otherwise moved. More particularly, a substrate index or movement signal 210 may be generated in an overlapping manner during the DC bias voltage and after the RF voltage ends (for example, a period $t_5$ after the RF voltage ends). The indexing or movement may be complete before or after a falling edge of the DC bias voltage (such as the DC bias voltage 200).

In addition, another DC bias voltage 215 may be supplied before subsequent RF plasma is struck and end shortly after the RF plasma is struck. The DC bias voltage 215 in FIG. 2 precedes the RF voltage by $t_3$ and has a duration $t_4$.

In FIG. 3, the DC bias voltage may also be supplied at other times during substrate processing. For example, a DC bias voltage 216 in FIG. 3 may be supplied continuously except for a period $t_6$ when the RF plasma is struck. For illustration purposes, the index or move signal is delayed by a period $t_7$ and has a longer duration $t_8$ as compared to the index or move signal from FIG. 2.

In the examples in FIGS. 1A-3, the DC bias voltage is supplied to the upper electrode 104. In this example, the DC bias voltage may be a positive DC voltage or a negative DC voltage. The voltage polarity is selected by experimentation and may depend on the architecture of the processing system (design and dimensions) and processing conditions. As can be appreciated, the DC bias voltage can be supplied to the lower electrode 107 instead of the upper electrode. The DC bias voltage may be supplied to the same electrode as the RF voltages or to a different electrode provided that the different electrode is not grounded.

Figure 4A:
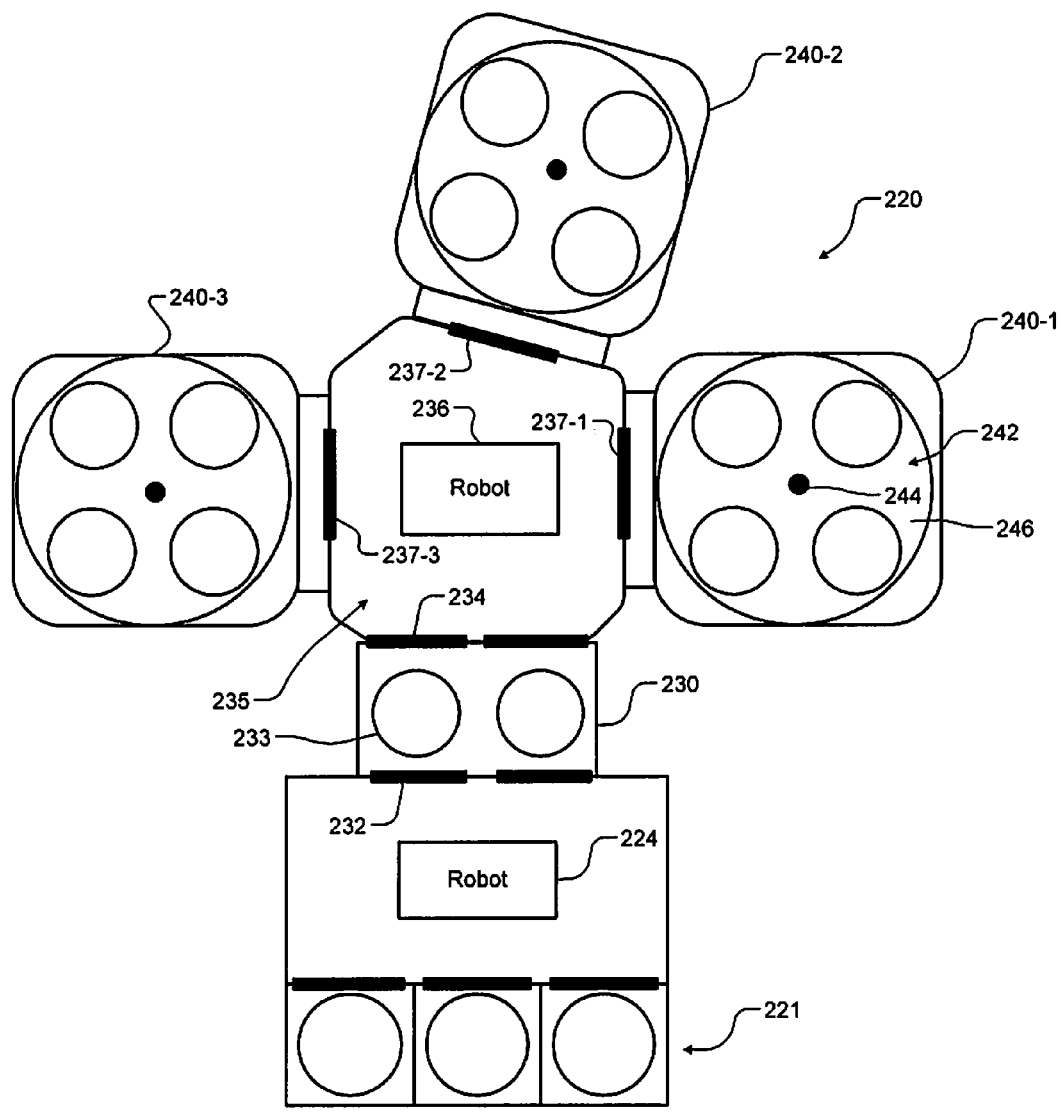
FIGS. 4A-4B and 5 illustrate examples of substrate processing tools.

Referring now to FIG. 4A, the substrate processing system 100 may be implemented in a tool 220 including multiple reactors each with multiple substrate processing systems. A substrate enters the tool 220 from a cassette loaded through a pod 221, such as the front opening unified pod (FOUP). A robot 224 includes one or more end effectors to handle the substrates. A pressure of the robot 224 is typically at atmospheric pressure. The robot 224 moves the substrates from the cassette to a load lock 230. For example, the substrate enters the load lock 230 through a port 232 and is placed on a load lock pedestal 233. The port 232 to the atmospheric environment closes and the load lock 230 is pumped down to an appropriate pressure for transfer. Then a port 234 opens and another robot 236 (also with one or more end effectors) places the substrates through one of the ports 237-1, 237-2, 237-3 (collectively ports 237) corresponding to a selected reactor 240-1, 240-2, and 240-3 (collectively reactors 240).

A substrate indexing mechanism 242 may be used to further position the substrates relative to the substrate processing chambers. In some examples, the indexing mechanism 242 includes a spindle 244 and transfer plates 246.

At least some of the stations of the reactors 240 correspond to the substrate processing system 100. The substrate processing systems 100 of the reactors 240 are capable of performing semiconductor processing operations, such as a material deposition or etch, sequentially or simultaneously with the other stations. At least some (and often all) of the stations perform RF-based semiconductor processing operations. The substrate is moved from one station to the next in the reactor 240 using the substrate indexing mechanism 242. One or more of the stations of the reactors 240 may be capable of performing RF plasma deposition or etching. During use, the substrates are moved to the reactors 240, processed and then returned to the pods 221. As can be appreciated, reducing the handling time of each substrate improves productivity and throughput.

Figure 4B:
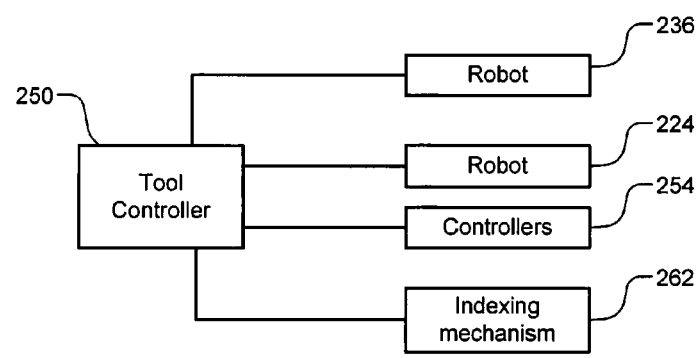

Referring now to FIG. 4B, a tool controller 250 may communicate with one or more controllers 254 that are associated with each of the stations of the reactors 240. Alternately, the tool controller 250 and the controllers 254 may be combined. The tool controller 250 also communicates with robots 224 and 236 and indexing mechanism controllers 262 to coordinate movement of the substrates and indexing of the substrates in each of the reactors 240.

Figure 5:
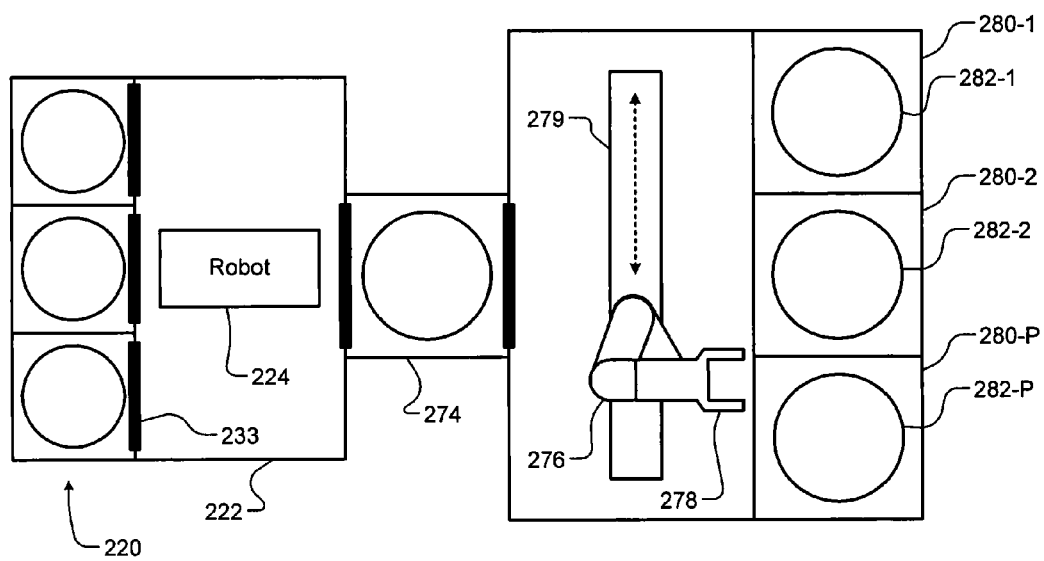

Referring now to FIG. 5, movement of the substrates may also be performed exclusively by a robot rather than robots and an indexing mechanism. Substrates are delivered to one port of a transfer chamber 274. The transfer chamber 274 pumps pressure therein to an appropriate level. Then, another port to the transfer chamber 274 opens and a robot 276 with one or more end effectors 278 delivers the substrate to a selected one of a plurality of processing chambers 280-1, 280-2, . . . , and 280-P (collectively processing chambers 280), where P is an integer greater than one. The robot 276 may move along a track 279. The robot 276 delivers the substrate onto one of a plurality of pedestals 282-1, 282-2, . . . , and 282-P corresponding to the selected one of the processing chambers 280.

Figure 6A:
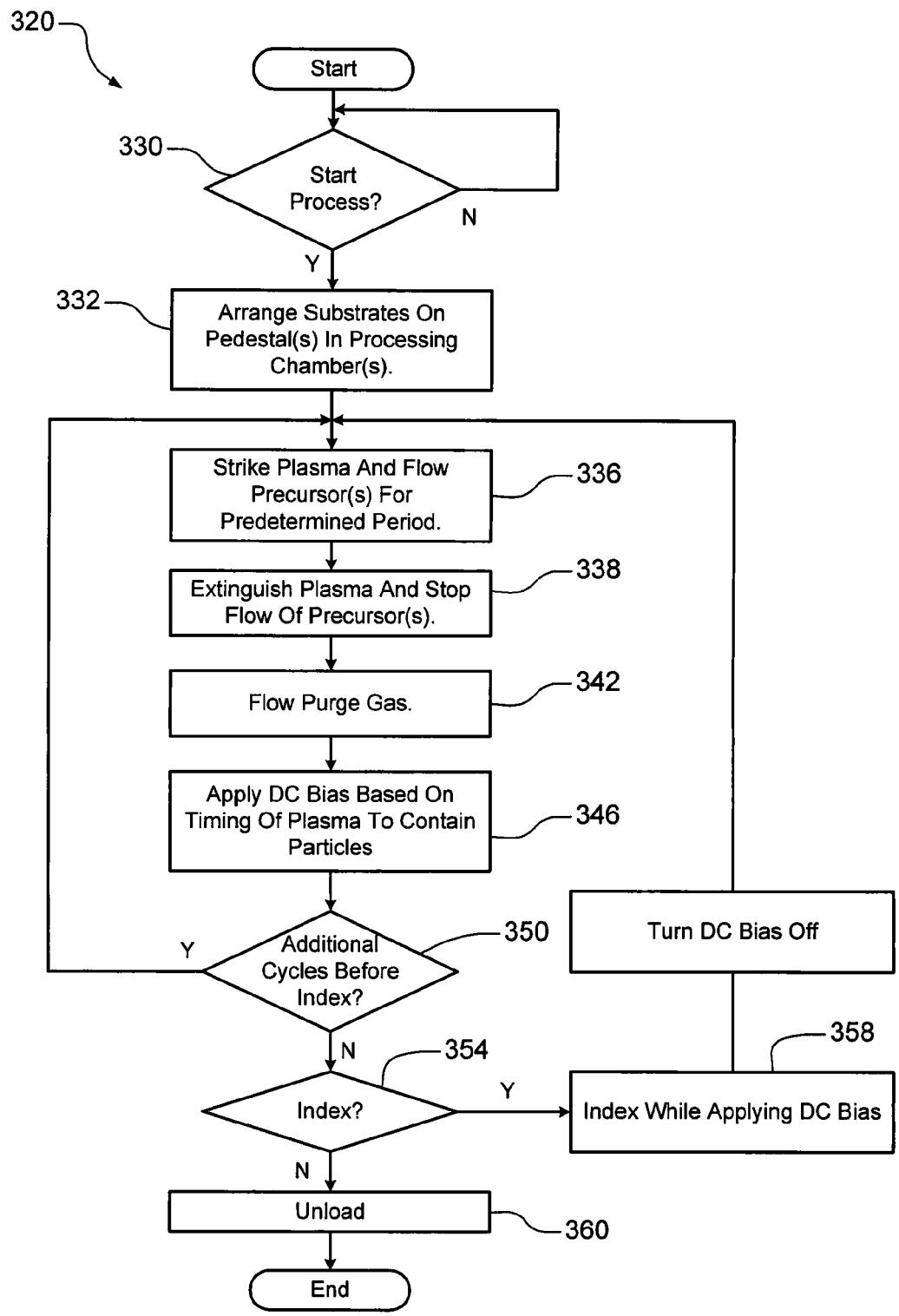
FIGS. 6A and 6B illustrates examples of methods for operating the substrate processing system according to the present disclosure.

Referring now to FIG. 6A, an example of a method 320 is shown. At 330, control determines whether the process has started. If true, control continues with 332 and arranges one or more substrates on one or more pedestals associated with one or more processing chambers. At 336, control strikes RF plasma in one or more of the processing chambers and flows precursor for a predetermined period. At 338, control extinguishes the RF plasma and stops the flow of precursors. At 342, control flows purge gas. At 346, control supplies a DC bias voltage for a predetermined bias period after the RF plasma is extinguished. In some examples, the predetermined bias period ends before the next RF plasma is struck.

At 350, control determines whether there are additional RF plasma cycles before indexing or other substrate movement occurs. If true, control returns to 336. Otherwise, control determines whether indexing or other movement is needed. If 354 is true, control continues with 358 and indexes or otherwise moves the substrates during the bias period, turns off the DC bias at 359 and then returns to 336. Otherwise, control continues with 360 and unloads the substrates.

Figure 6B:
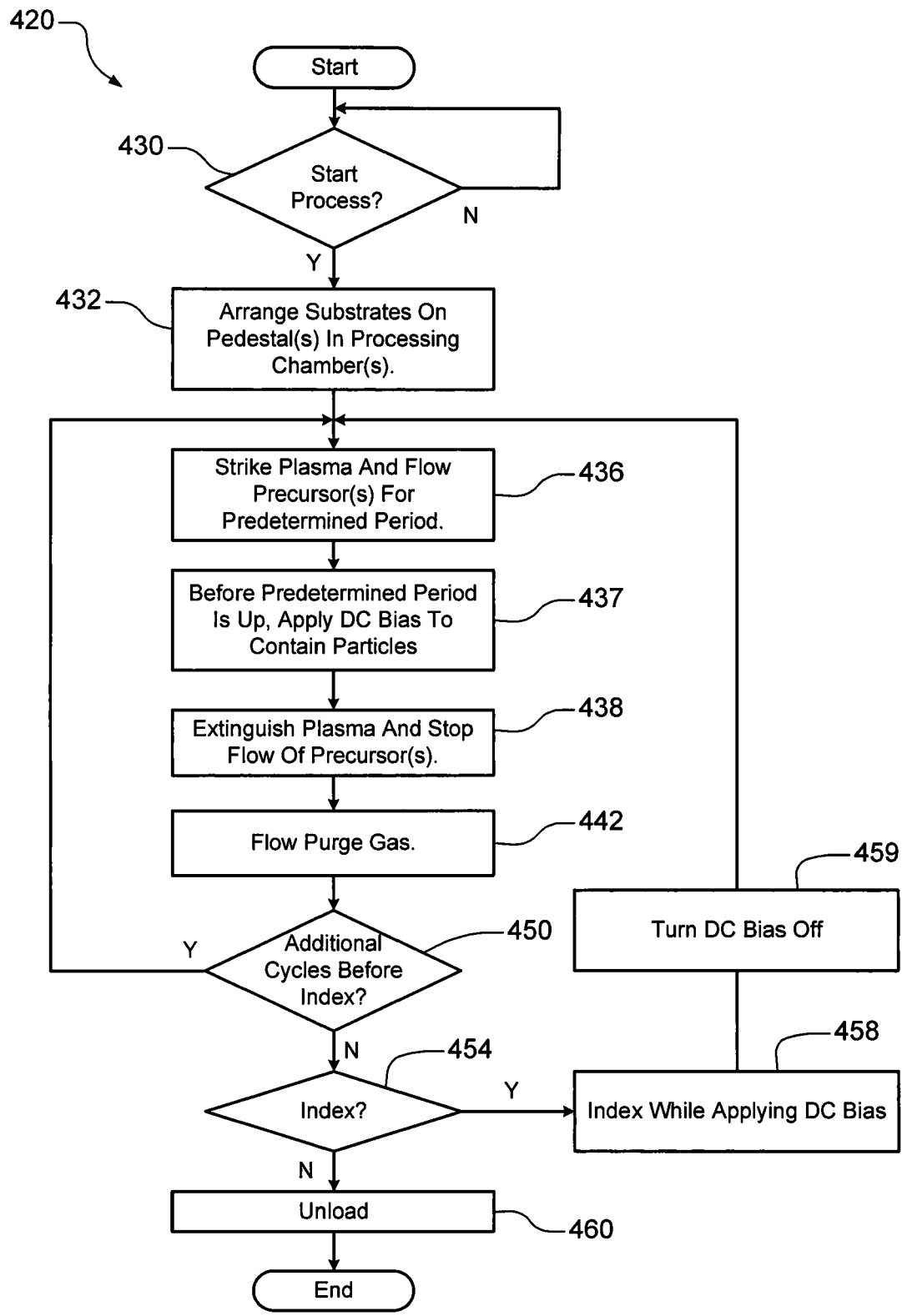

Referring now to FIG. 6B, an example of a method 420 is shown. At 430, control determines whether the process has started. If true, control continues with 432 and arranges one or more substrates on one or more pedestals associated with one or more processing chambers. At 436, control strikes plasma in one or more of the processing chambers and flows precursor for a first predetermined period. At 437, control supplies a DC bias voltage for a predetermined bias period starting before the first predetermined period is up (and the RF plasma is extinguished). In some examples, the predetermined bias period ends before a subsequent RF plasma is struck. At 438, control extinguishes the RF plasma and stops the flow of precursors. At 442, control flows purge gas. At 450, control determines whether there are additional RF plasma cycles before indexing or other substrate movement occurs. If true, control returns to 436. Otherwise, control determines whether indexing or other movement is needed. If 454 is true, control continues with 458 and indexes or otherwise moves the substrates, turns off the DC bias at 459 and then returns to 436. Otherwise, control continues with 460 and unloads the substrates.

Figure 7:
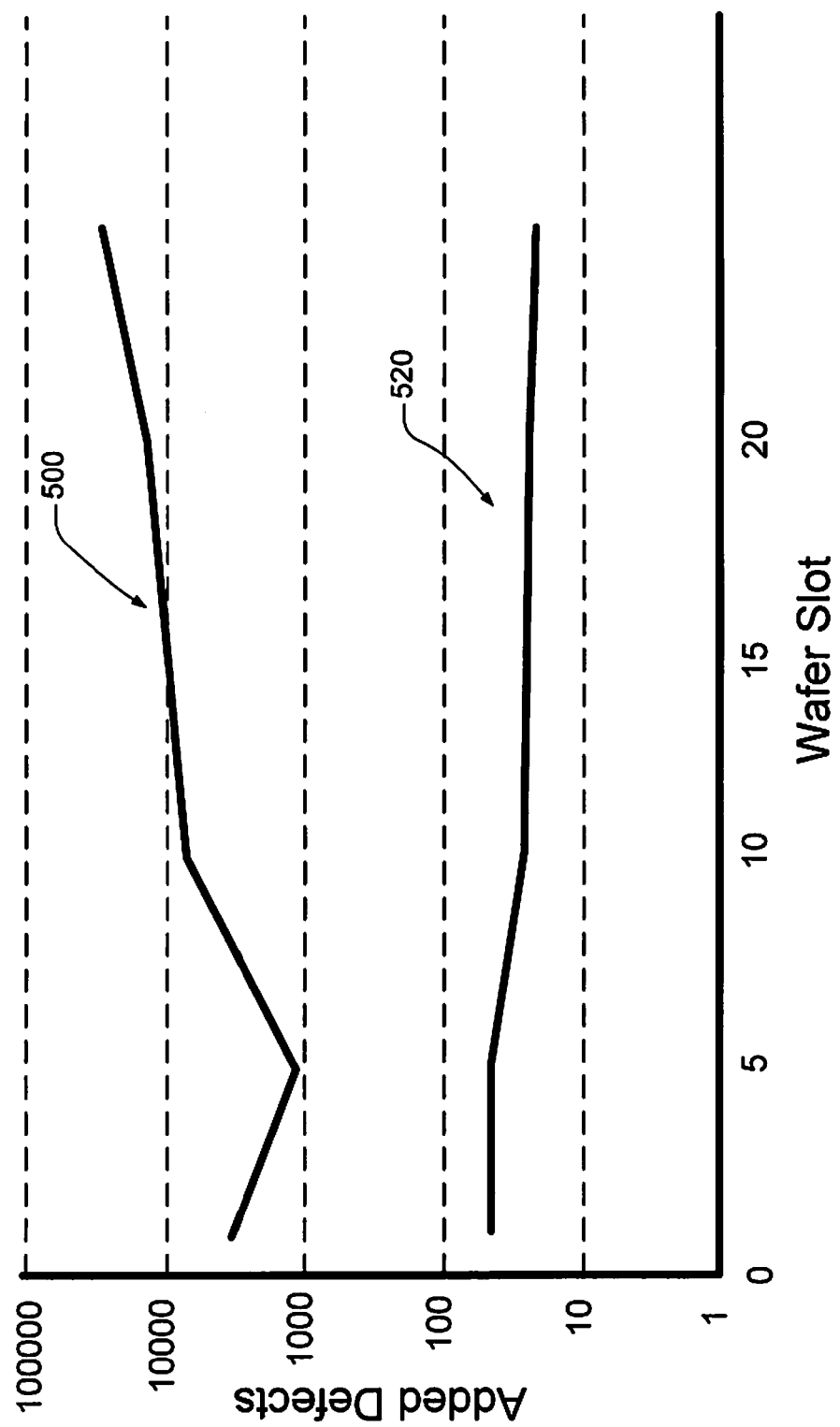
FIG. 7 illustrates defect counts for substrates that were processed with and without the DC bias voltage.

Referring now to FIG. 7, the number of defects on the substrate is reduced by supplying the DC bias. The number of defects for a process is shown at 500 when the DC bias voltage is not supplied during substrate movement and at 520 when the DC bias voltage is supplied during substrate movement. DC bias voltage applied during substrate movement eliminates unproductive waiting time that is usually necessary to pump out residual gases and settle gas phase particles before movement takes place.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A substrate processing system comprising:
   a processing chamber;
   an upper electrode arranged in the processing chamber;
   a pedestal arranged in the processing chamber, wherein the pedestal is configured to support a substrate during processing and wherein the pedestal includes a lower electrode;
   an RF generating system configured to generate RF plasma in the processing chamber between the upper electrode and the lower electrode by supplying an RF voltage to one of the upper electrode and the lower electrode;
   a bias generating circuit configured to selectively supply a DC bias voltage to the one of the upper electrode and the lower electrode;
   a substrate movement system configured to move the substrate relative to the pedestal while the DC bias voltage is generated; and
   a controller configured to:
      cause the bias generating circuit to initiate the DC bias voltage at at least one of: a first predetermined period before the RF plasma is extinguished or a second predetermined period after the RF plasma is extinguished;
      cause generation of a movement signal to cause the substrate movement system to move the substrate relative to the pedestal while the DC bias voltage is generated; and
      cause the bias generating circuit to end the DC bias voltage at a third predetermined period after the RF plasma is extinguished and before a subsequent RF plasma is struck.

2. The substrate processing system of claim 1, wherein the bias generating circuit includes:
   a DC voltage supply; and a synchronization circuit in communication with the DC voltage supply and configured to generate the DC bias voltage.

3. The substrate processing system of claim 2, wherein the bias generating circuit further includes a low pass filter configured to filter an output of the synchronization circuit and having an output in communication with one of the upper electrode and the lower electrode.

4. The substrate processing system of claim 1, wherein the substrate movement system includes a robot configured to move the substrate relative to the pedestal.

5. A substrate processing tool comprising:
N reactors each including the substrate processing system of claim 1, where N is an integer greater than zero, wherein the substrate movement system of the substrate processing system includes an indexing mechanism configured to index substrates between a plurality of stations within at least one of the N reactors while the DC bias voltage is generated.

6. The substrate processing system of claim 1, wherein the DC bias voltage and the RE voltage are both connected to one of the upper electrode and the lower electrode.

7. The substrate processing system of claim 1, wherein the controller is further configured to cause the bias generating circuit to generate the DC bias voltage at the first predetermined period before the RF plasma is extinguished and to end the DC bias voltage before the subsequent RF plasma is struck.

8. The substrate processing system of claim 1, wherein the controller is further configured to cause the bias generating circuit to generate the DC bias voltage at the second predetermined period after the RF plasma is extinguished and to end the DC bias voltage before the subsequent RF plasma is struck.

9. The substrate processing system of claim 1, wherein the controller is further configured to cause the bias generating circuit to generate the DC bias voltage continuously except during a period when the RF plasma is struck.

10. The substrate processing system of claim 1, wherein the RF generating system includes:
an RF generator to generate the RF voltages; and
a matching and distribution network in communication with the RF generator and the one of the upper electrode and the lower electrode.

11. A substrate processing system comprising:
a processing chamber;
an upper electrode arranged in the processing chamber;
a pedestal arranged in the processing chamber, wherein the pedestal is configured to support a substrate and wherein the pedestal includes a lower electrode;
an RF generating system configured to generate RF plasma in the processing chamber between the upper electrode and the lower electrode by supplying an RF voltage to the upper electrode;
a bias generating circuit configured to selectively start supplying a DC bias voltage to the upper electrode;
a substrate movement system configured to move the substrate relative to the pedestal while the DC bias voltage is generated; and
a controller configured to:
cause the bias generating circuit to initiate the DC bias voltage at at least one of: a first predetermined period before an end of the RF voltage or a second predetermined period after the RF voltage has ended;
cause generation of a movement signal to cause the substrate movement system to move the substrate relative to the pedestal while the DC bias voltage is generated; and
cause the bias generating circuit to end the DC bias voltage at a third predetermined period after the RE voltage has ended and before a subsequent RF voltage is initiated.

12. The substrate processing system of claim 11, wherein the bias generating circuit includes:
a DC voltage supply; and
a synchronization circuit in communication with the DC voltage supply and configured to generate the DC bias voltage.

13. The substrate processing system of claim 12, wherein the bias generating circuit further includes a low pass filter configured to filter an output of the synchronization circuit and having an output in communication with the upper electrode.

14. The substrate processing system of claim 11, further comprising a robot configured to move the substrate relative to the pedestal, wherein the robot moves the substrate while the DC bias voltage is generated.

15. A substrate processing tool comprising:
N reactors each including the substrate processing system of claim 11, where N is an integer greater than zero; and
an indexing mechanism configured to index substrates between a plurality of stations within at least one of the N reactors while the DC bias voltage is generated.

16. The substrate processing system of claim 11, wherein the controller is further configured to cause the bias generating circuit to generate the DC bias voltage at the first predetermined period before the RF plasma is extinguished and to end the DC bias voltage after the RF plasma is extinguished.

17. The substrate processing system of claim 11, wherein the controller is further configured to cause the bias generating circuit to generate the DC bias voltage at the second predetermined period after the RF plasma is extinguished and to end the DC bias voltage before a subsequent RF plasma is struck.

18. The substrate processing system of claim 11, wherein the controller is further configured to cause the bias generating circuit to generate the DC bias voltage continuously except when the RF plasma is struck.

19. The substrate processing system of claim 11, wherein the RF generating system includes:
an RF generator to generate the RF voltages; and
a matching and distribution network in communication with the RF generator and the upper electrode.

20. The substrate processing system of claim 1, wherein the controller is further configured to cause generation of the movement signal that at least partially overlaps with the DC bias voltage.

* * * * *